US012738947B2

(12) United States Patent
Sahu et al.

(10) Patent No.: US 12,738,947 B2
(45) Date of Patent: Sep. 15, 2026

(54) PHASE LOCKED LOOP HAVING A FILTER WITH MULTIPLE AMPLIFIERS

(71) Applicant: TEXAS INSTRUMENTS INCORPORATED, Dallas, TX (US)

(72) Inventors: Debapriya Sahu, Bangalore (IN); Prakhar Agrawal, Bangalore (IN); Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 19/008,469

(22) Filed: Jan. 2, 2025

(65) Prior Publication Data

US 2026/0189235 A1 Jul. 2, 2026

(51) Int. Cl.
*H03L 7/093* (2006.01)
*H03F 3/45* (2006.01)

(52) U.S. Cl.
CPC ......... *H03L 7/093* (2013.01); *H03F 3/45264* (2013.01)

(58) Field of Classification Search
CPC ............................ H03L 7/093; H03F 3/45264
USPC ....................................... 327/552; 331/8, 16
See application file for complete search history.

(56) References Cited

U.S. PATENT DOCUMENTS 5,334,953 A * 8/1994 Mijuskovic ............ H03L 7/183 331/10
8,760,203 B1 6/2014 Amourah
2004/0155702 A1 * 8/2004 Danielsson ............ A61B 5/308 327/552
2009/0066446 A1 3/2009 Sahu et al.
2015/0326236 A1 11/2015 Thiagarajan et al.
2023/0396259 A1 12/2023 Sahu et al.

FOREIGN PATENT DOCUMENTS

WO 2022147137 A1 7/2022

* cited by examiner

*Primary Examiner* — Arnold M Kinkead
(74) *Attorney, Agent, or Firm* — Michelle F. Murray; Frank D. Cimino

(57) ABSTRACT

A system includes a phase locked loop (PLL), which includes a filter. The filter may include a first amplifier and a second amplifier, where a feedback current from the first amplifier and the second amplifier is based on a parallel resistance of multiple parallel feedback resistors. The feedback current may be coupled to a noninverting input of the first amplifier.

25 Claims, 5 Drawing Sheets

PHASE LOCKED LOOP HAVING A FILTER WITH MULTIPLE AMPLIFIERS

TECHNICAL FIELD

The present application relates to circuits, generally, and more specifically to a phase locked loop (PLL) having a filter with multiple amplifiers.

BACKGROUND

A phase locked loop (PLL) may include a closed-loop feedback control circuit, which provides an output signal that is locked in phase and frequency with an input signal used as a reference.

SUMMARY

In accordance to an embodiment, a circuit includes: a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, where the second terminal of the second resistor is coupled to the first input of the first amplifier, and where the second input of the second amplifier is coupled to the first terminal of the first resistor and the second terminal of the first capacitor.

In accordance to an embodiment, a phase locked loop (PLL) includes: a phase frequency detector (PFD) having a reference input, a feedback input, and an output; a charge pump having an input coupled to the output of the PFD, the charge pump further having an output; a filter having an input coupled to the output of the charge pump and having an output; and a voltage-controlled oscillator (VCO) having an input coupled to the output of the filter and having an output coupled to the feedback input of the PFD, where the filter includes a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, and where the second terminal of the second resistor is coupled to the first input of the first amplifier, and where the second input of the second amplifier is coupled to the first terminal of the first resistor and the second terminal of the first capacitor.

In accordance to an embodiment, a method includes: receiving a charge pump output of a charge pump at a first input of a first amplifier; generating a first output voltage at an output of the first amplifier, where an output of the first amplifier is coupled to the first input of the first amplifier by a first capacitor and a first resistor; generating a second output voltage at an output of a second amplifier, the second amplifier having a first input and a second input, where the first input of the second amplifier is coupled to the output of the second amplifier, and where the second input of the second amplifier is coupled to a first terminal of the first capacitor and a first terminal of the first resistor; and generating a feedback current based on an output of the second amplifier and based on a current flowing through the first resistor; and providing the feedback current to an intermediate node coupled between the charge pump and the first input of the first amplifier.

In accordance to an embodiment, a device includes: phase locked loop (PLL) including: a phase frequency detector (PFD) having a reference input, a feedback input, and an output; a charge pump having an input coupled to the output of the PFD, the charge pump further having an output; a loop filter having an input coupled to the output of the charge pump and having an output; and a voltage-controlled oscillator (VCO) having an input coupled to the output of the filter and having an output coupled to the feedback input of the PFD, where the filter includes a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, and where the second terminal of the second resistor is coupled to the first input of the first amplifier, and where the second input of the second amplifier is coupled to the first terminal of the first resistor and the second terminal of the first capacitor; and a radio-frequency (RF) front end having an input coupled to the output of the VCO.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION

Figure 1:
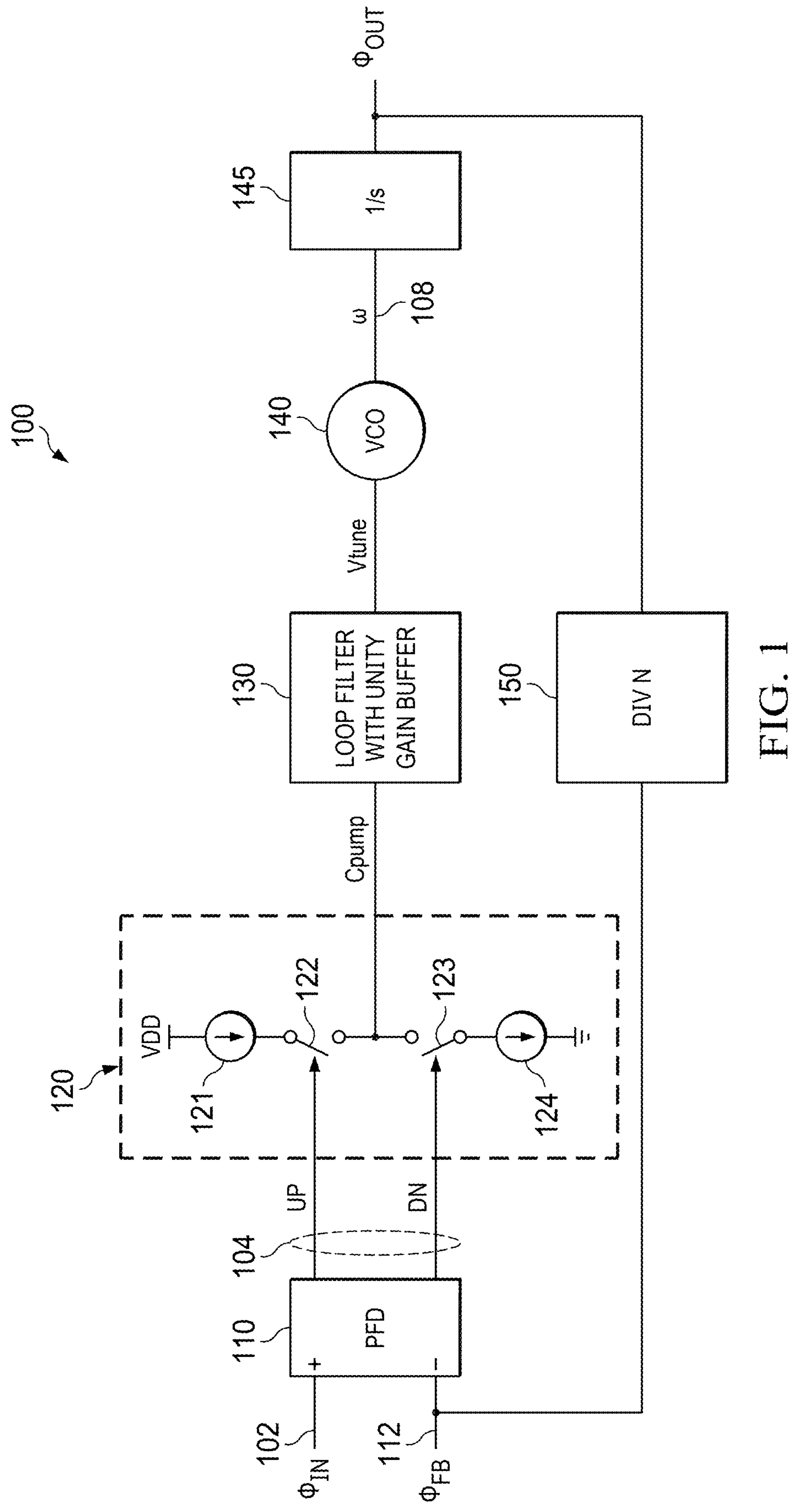
FIG. 1 illustrates an example PLL, according to some embodiments.

The present disclosure is described with reference to the attached figures. The figures are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The description below illustrates various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Various embodiments include a phase locked loop (PLL) having a filter, where the filter may include multiple amplifiers, e.g., arranged to provide favorable noise performance and/or to reduce a size of capacitors.

An example embodiment includes a filter, which receives current as an input from a charge pump and outputs voltage to a voltage-controlled oscillator (VCO). The filter includes a first amplifier, which is arranged to receive the output of the charge pump at a first input and to receive a biasing voltage at a second input. The output of the first amplifier is coupled to the input of the VCO. Furthermore, the output of the first amplifier is fed back to the first input of the first amplifier. The feedback includes a capacitor and a first resistor (RZ), where the capacitor is coupled to the output of the first amplifier, the capacitor is also coupled to the first resistor, and the first resistor is coupled to the first input of the first amplifier.

The example filter may also include a second amplifier arranged as a voltage follower. A first input of the second amplifier is coupled to a point between the capacitor and the first resistor. An output of the second amplifier is coupled to the first input of the first amplifier via the second resistor. The other input of the second amplifier is coupled to the output of the second amplifier. A second resistor (RFB) is disposed between the output of the second amplifier and the charge pump input of the first amplifier.

Continuing with the example, the feedback current may be the parallel sum of currents through the first resistor and the second resistor. In some embodiments of the example PLL, a larger feedback current may be associated with a larger signal-to-noise ratio. The parallel sum of the first resistor and the second resistor may be associated with a larger feedback current, thereby increasing the signal-to-noise ratio of the filter. Furthermore, the size of the first resistor may be inversely proportional to the size of the capacitor, so that a relatively large first resistor may be paired with a relatively small capacitor and vice versa. In some examples, the first resistor may be sized to be relatively large so that a relatively small capacitor may be used. The relatively small capacitor may use less semiconductor area, thereby advantageously allowing for a more efficient size of the PLL architecture.

FIG. 1 illustrates an example PLL 100, according to some embodiments. PLL 100 may be implemented on a single semiconductor die or on multiple semiconductor dies, and those one or more semiconductor dies may be implemented within one or more semiconductor packages. The PLL 100 includes a phase frequency detector (PFD) 110, a charge pump (CP) 120, a loop filter 130, a voltage-controlled oscillator (VCO) 140, and a divider 150. The PFD 110 compares a feedback signal 112 received from the divider 150 with a reference signal 102 and generates an error signal 104 which is proportional to the magnitude of the phase/frequency difference between them. The PFD 110 provides the error signal 104 to the CP 120.

The CP 120 provides a current output (Cpump) to control a magnitude of the charge stored in the loop filter 130, thus converting the output of the PFD 110 to a control voltage input Vtune usable by the VCO 140 to control the output signal 108. In some examples, there may be one or more resistive capacitive (RC) filter stages (not shown) disposed between the loop filter 130 and the VCO 140. Example charge pump 120 includes a first current source 121, a second current source 124, and first and second switches 122, 123. Switches 122, 123 may be configured to create or break current paths toward the CP output or toward supply and ground terminals. The first current source 121 is coupled to a power supply terminal having a voltage value VDD. The first current source 121 is coupled to switch 122, where switch 122 either couples the output of the first current source 121 to the input of the loop filter 130 (switch 122 is on) or isolates the first current source 121 from the input of the loop filter (switch 122 is off). In this example, the on or off state of switch 122 is controlled by the UP output terminal of PFD 110.

The second current source 124 is coupled between switch 123 and a power supply terminal at a ground voltage. When switch 123 is in an on state, switch 123 couples current source 124 to the input of the loop filter 130. When switch 123 is in an off state, switch 123 isolates current source 124 from the input of the loop filter 130. In this example, the on or off state of switch 123 is controlled by the DN terminal of PFD 110.

In some embodiments, the error signal 104 includes both a UP component and a DN component. When the error signal 104 includes assertion of the UP component, switch 122 is enabled. When the error signal 104 includes assertion of the DN component, switch 123 is enabled. In some implementations, only one of the UP or DN components is asserted at a given time, and when signals 102 and 112 are matched in phase, neither the UP nor the DN components may be asserted. Of note in charge pump 120, the charge pump output Cpump is either zero or is a positive or negative value based on the sizes of the current sources 121, 124 (e.g., it may be in only one of three possible states, assuming negligible transient times). Thus, in this example, the charge pump output Cpump may be a current pulse which may be either positive or negative in value and has a duration that depends on the phase difference between signals 102 and 112.

In some embodiments, the magnitude of the positive current pulse and the negative current pulse is the same.

Figure 2:
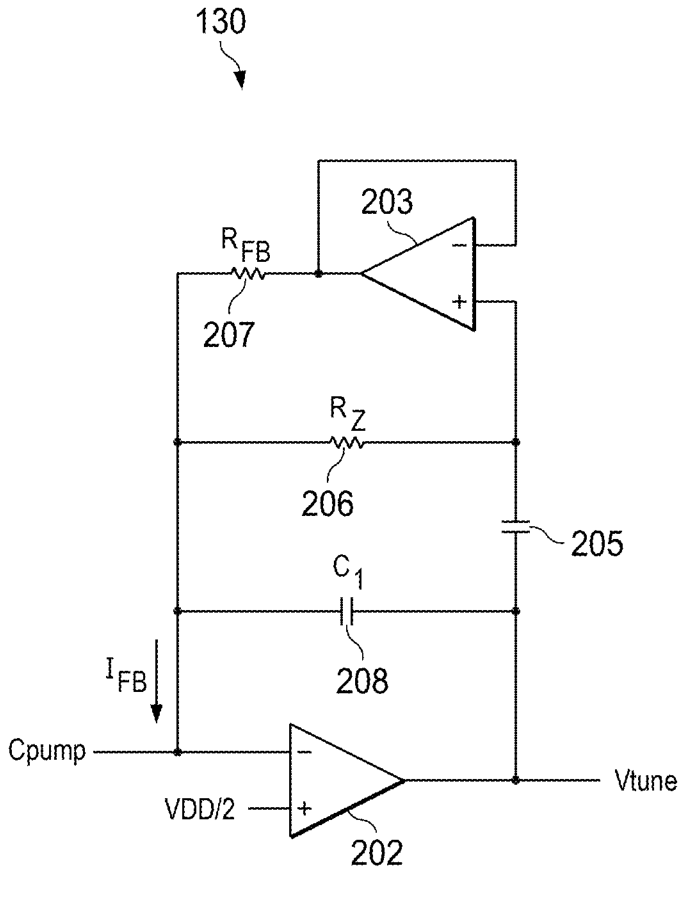
FIG. 2 is an illustration of an example implementation of the loop filter of FIG. 1, according to some embodiments.

In some embodiments, the loop filter 130 includes a unity gain buffer, such as amplifier 203, which is described in more detail with respect to FIG. 2.

The VCO 140 generates an output frequency signal 108 proportional to the control voltage input Vtune. PLL 100 further includes frequency phase conversion module 145, which converts the VCO output 108 to a phase, which may be received by the divider 150 in the feedback loop. In the present example, when the PLL 100 is "locked", there may be a constant phase difference (usually zero) between the feedback signal 112 and a reference signal 102 and their frequencies are matched. In some examples, the phase conversion module 145 may not actually be a physical, separate component. Instead, in some examples, the VCO 140 is configured to input voltage information (or signal) and to output phase information.

FIG. 2 is an illustration of an example implementation of loop filter 130, according to some embodiments. For instance, the example implementation of FIG. 2 may be used as the loop filter 130 in the example of FIG. 1. Also, while FIG. 2 provides specific values for resistors 207, 206, capacitor 205, and Cpump, it is understood that such values are for example only. Other implementations may be adapted by changing one or more of those values as appropriate to provide desired operating characteristics.

Loop filter 130 includes a first amplifier 202 having an inverting (−) input, a noninverting (+) input, and an output. Loop filter 130 also includes a second amplifier 203 having an inverting input, a noninverting input, and an output. Resistor 206 may be referred to as a zero resistor (RZ), and it is disposed within a feedback path between the output of amplifier 202 and the inverting input of amplifier 202.

Loop filter 130 also includes capacitor 205, which has a first terminal and a second terminal, where the first terminal is coupled to the output of the amplifier 202, and the second terminal of the capacitor 205 is coupled to a first terminal of the resistor 206. A second terminal of the resistor 206 is coupled to the inverting input of the amplifier 202.

Resistor 207 may be referred to as a feedback resistor (RFB) in some examples. Resistor 207 includes a first terminal and a second terminal, with the first terminal being coupled to the output of the amplifier 203 and the second terminal of the resistor 207 being coupled to the inverting input of the amplifier 202. The noninverting input of amplifier 203 is coupled to the first terminal of the resistor 206 and the second terminal of the capacitor 205. Amplifier 203 is implemented as a voltage follower, where its inverting input is coupled to its output at a point between the output of amplifier 203 and the first terminal of the resistor 207.

Capacitor 208 is coupled in parallel with resistor 206 and capacitor 205. Capacitor 208 may be sized as appropriate and in some embodiments may be more than an order of magnitude smaller than capacitor 205.

In some embodiments, the feedback current $I_{FB}$ is zero when error signal 104 is zero. In some embodiments, when error signal 104 is not zero, then the feedback current $I_{FB}$ is approximately a same magnitude and opposite polarity of the current Cpump, thereby working to cancel the current Cpump. In this example, when Cpump is nonzero, it has a magnitude of 260 μA.

In some embodiments, each of the amplifiers 202, 203 is internally biased between a first power supply voltage level (VDD) and a second power supply voltage level (e.g., ground). This is described in more detail with respect to FIG. 3. In some embodiments, the noninverting input of amplifier 202 is held at VDD/2, and the inverting input is coupled to Cpump and IFB. As a result of the biasing, the output voltage Vtune is VDD/2 as well.

In the present example, there is no DC current flowing through resistor 206, so that the terminals on both sides of resistor 206 are at the same voltage. The noninverting input of amplifier 203 is coupled between resistor 206 and capacitor 205. The output of amplifier 202 (Vtune) is set by the PLL loop so that the VCO 140 oscillates at a desired frequency such that the phase error between signals 102 and 112 is zero when the amplifier 203 is configured as a voltage follower that has unity gain by virtue of the feedback from the noninverting input to the output of amplifier 203. The amplifier 203 has its noninverting input at VDD/2, and once the circuit settles, the inverting input of amplifier 203 is also at VDD/2 as is the output of the amplifier 203. Thus, the inverting input of amplifier 202, coupled to the inverting input of amplifier 202, is also at VDD/2.

In the present example, resistor 206 is scaled up to have a relatively large value, which may advantageously allow for selection of a smaller capacitor 205 for a particular corner frequency of the filter. For example, in an embodiment, $R_{FB}$ may be 80 kΩ while capacitor 205 may be 60 pF. Other values can be used.

In some designs, capacitors may take up relatively large area on a semiconductor die, and selecting a smaller capacitor may favorably allow for reduction of the size of the total circuit. Furthermore, the feedback current $I_{FB}$ is a sum of currents through resistors 206 and 207. The parallel sum of resistors may be given by Equation 1, where RT is a total resistance.

$$1/RT=(1/R1)+(1/R2) \qquad \text{Eq. 1}$$

In an example in which the total resistance RT is targeted to be relatively low, such as 8 kΩ, to allow for a relatively small capacitor 205, such as 60 pF, resistors 206 and 207 may be sized as 80 kΩ and 8.8 kΩ, respectively. Thus, in this example, the resistive value of resistor 206 is more than nine times the resistive value of resistor 207 while, according to Equation 1, the sum total of resistors 206 and 207 in parallel is 8 kΩ, which is an order of magnitude less than the value of resistor 206. Thus, in some embodiments, the architecture of FIG. 2 allows for a relatively small capacitor 205 while also allowing for a feedback current $I_{FB}$ which is larger than a feedback current that would be inversely proportional to the value of resistor 206 alone. In some embodiments, having a larger feedback current $I_{FB}$ may be advantageous for receiving a larger current from the output Cpump of the charge pump 120, which may advantageously result in less noise and higher signal to noise ratio. Additionally, by supplying most of the current $I_{FB}$ with amplifier 203 via resistor 207 as opposed to via resistor 206, noise may advantageously be further reduced.

As can be seen in FIG. 2, the amplifier 203 senses and reacts to the voltage that is between resistor 206 and capacitor 205. As noted above, there is no DC current through resistor 206, though capacitor 205 may charge and discharge based on the value of Cpump. The amplifier 203 senses the voltage between resistor 206 and capacitor 205 and turns that voltage into a current through resistor 207. Thus, the amplifier 203 may act as a transconductance amplifier, and its transconductance behavior may advantageously stay relatively linear, even though capacitor 205 may charge and discharge, by virtue of the feedback from the inverting input to the output of amplifier 203.

In the example of FIG. 1, in some embodiments, a relatively large value for the current Cpump corresponds to a relatively large and favorable signal-to-noise ratio; and Cpump approaching a magnitude of zero may result in a lower and less favorable signal-to-noise ratio. Each design may have a different tolerance for signal-to-noise ratio and a different ability to handle larger or smaller values for Cpump. In an embodiment, a value of 260 μA for the charge pump current Cpump is large enough to be favorable from a signal-to-noise ratio standpoint. The magnitude of the current Cpump is designed by selecting a value for current sources 121 and 124, and as noted above the feedback current $I_{FB}$ may be configured to have a magnitude approximately the same as that of Cpump. Therefore, the parallel sum of resistors 206 and 207 given by Eq. 1 may be selected to allow for a desired magnitude for the feedback current $I_{FB}$. The parallel sum of resistors 206 and 207 may be designed by selecting individual values for resistors 206 and 207, such as by selecting a relatively large value of resistor 206 to allow for relatively small value of capacitor 205.

As shown in FIG. 2, the zero resistor 206 is not coupled to ground, either directly or indirectly. Rather, the resistor 206 is coupled between the noninverting input of amplifier 203 and the output of amplifier 203 (via resistor 207), which is also coupled to the inverting input of amplifier 202. Such arrangement of zero resistor 206 as well as the unity gain feedback of amplifier 203 may allow for a more stable and linear transconductance behavior of loop filter 130 over the expected range of operating voltages, when compared with loop filters having the zero resistor coupled to ground, directly or indirectly.

Also as noted above, the biasing of amplifier 203 is such that the noninverting input, inverting input, and output are at VDD/2. The same is true for amplifier 202. The value of VDD/2 may advantageously allow for stable operation, even at reset or power up of filter 130, because the inverting input, the noninverting input, and the output of amplifier 202 and 203 are unlikely to decrease or increase to a rail voltage (VDD or ground). Thus, various implementations may provide for relatively quick settling of the circuit during reset or power up.

Figure 3:
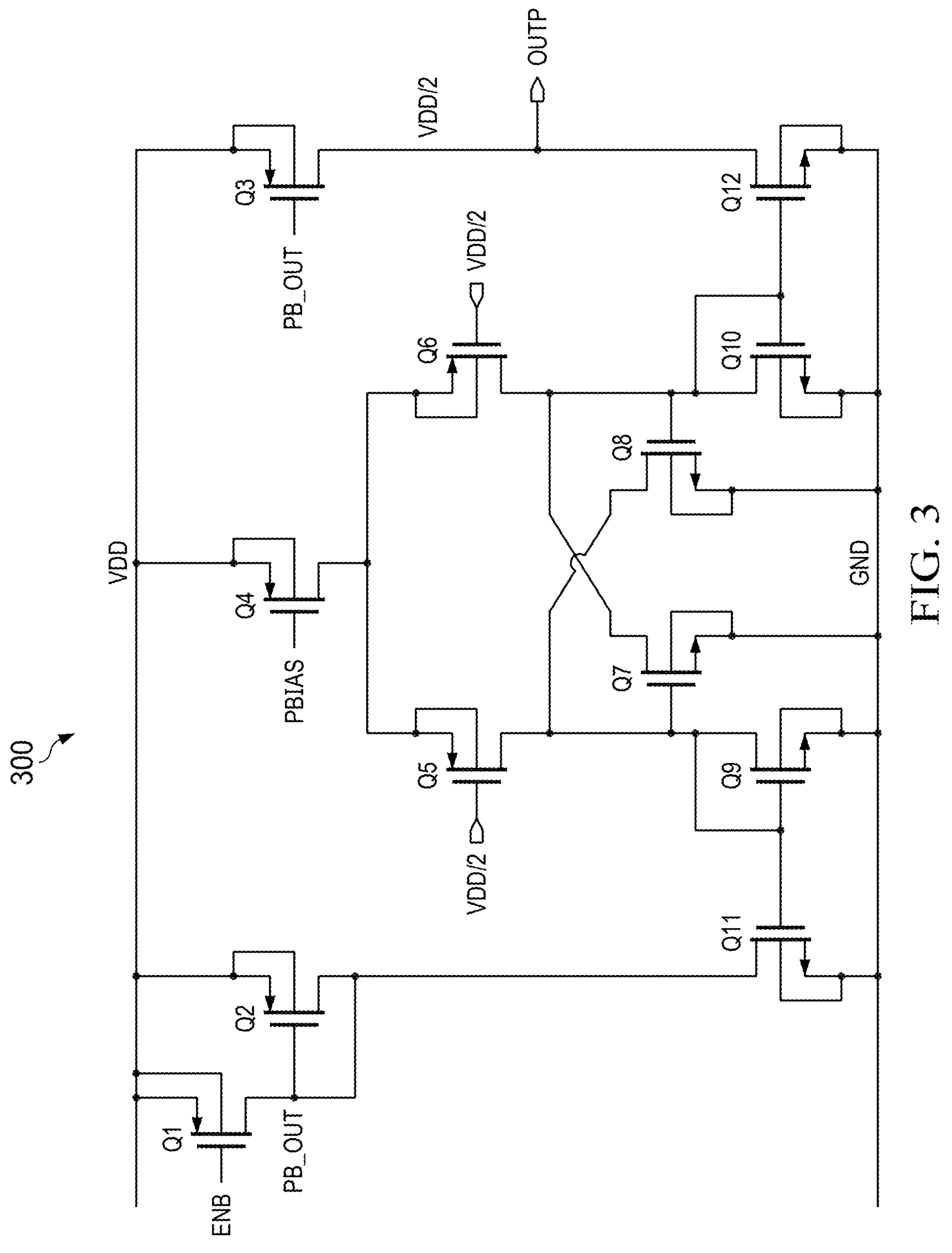
FIG. 3 is an illustration of an example operational amplifier, according to some embodiments.

FIG. 3 is an illustration of an example operational amplifier 300, according to some embodiments. Either or both of amplifiers 202, 203 may be implemented according to the architecture described with respect to operational amplifier 300.

Operational amplifier 300 is coupled between two power supply terminals, a first one of the power supply terminals being at a value of VDD, and a second one of the power supply terminals being at a value of ground (GND).

Operational amplifier 300 has a bias leg, which includes transistors Q2 and Q11. Operational amplifier 300 also has a differential input first stage, including transistors Q4-Q10. Operational amplifier 300 further includes a common source second stage, which includes transistors Q3 and Q12. Transistor Q1 is a P type metal oxide semiconductor (PMOS) transistor and is configured as an enable switch, where a low-voltage at the gate of transistor Q1 turns transistor Q1 on. The source of transistor Q1 is coupled to VDD, and the drain of Q1 is coupled to the gate of Q2 and to the drain of Q2, which is also a PMOS transistor. When Q1 is on, that applies a high voltage (approximately VDD, referred to as PB_OUT) to the gate and source of transistor Q2, thereby turning transistor Q2 off. The PB_OUT is also applied to the gate of PMOS transistor Q3, thereby turning transistor Q3 off. In this state, the operational amplifier 300 is disabled. By contrast, a high voltage at the gate of transistor Q1 turns transistor Q1 off and enables the operational amplifier 300.

Transistors Q2 and Q11 are coupled in series between VDD and ground. Transistor Q2 is arranged so that its source is coupled to VDD, and its drain is coupled to a drain of N-type metal oxide semiconductor (NMOS) transistor Q11. The gate of transistor Q2 is coupled to the drain of transistor Q2. Transistor Q11 is arranged so that its drain is coupled to a drain of transistor Q2 and its source is coupled to ground. The gate of transistor Q11 is coupled to the gate of NMOS transistor Q9 and to the drain of PMOS transistor Q5 and to the gate of NMOS transistor Q7.

Transistors Q4-Q10 are configured as a differential input first stage of the operational amplifier 300. Transistor Q4 is a PMOS transistor, and it is coupled in series between VDD and the sources of PMOS transistors Q5 and Q6. The gate of transistor Q4 may be controlled by a bias voltage PBIAS, which may be applied in any appropriate manner. During normal operation, PBIAS may be configured to hold transistor Q4 in an on state (saturation region).

Transistor Q5 is arranged so that its source is coupled to the drain of transistor Q4, and its drain is coupled to the drain of NMOS transistor Q9. Transistor Q9 has its source coupled to ground. The gate of transistor Q5 is configured to operate as an inverting input for the operational amplifier 300. Transistor Q6 is arranged so that its source is coupled to the drain of transistor Q4, and the drain of transistor Q6 is coupled to the drain of NMOS transistor Q10. Transistor Q6 is configured so that its gate may be used as a noninverting input of operational amplifier 300.

Transistor Q10 is coupled to ground through its source. Transistor Q10 and NMOS transistor Q12 are gate coupled to each other. Furthermore, the gate and drain of transistor Q10 are coupled together.

Transistor Q7 is an NMOS transistor, having a drain coupled to the drain of transistor Q6 and a source coupled to ground. The gate of transistor Q7 is coupled to the drain of transistor Q5.

Transistor Q8 is an NMOS transistor having its drain coupled to the drain of transistor Q5 and its source coupled to ground. The gate of transistor Q8 is coupled to the drain of transistor Q6.

NMOS transistor Q9 is coupled in series between Q5 and ground, and the drain and gate of transistor Q9 are coupled together. Transistor Q9 is also gate coupled to transistor Q11. The source of transistor Q9 is coupled to ground.

NMOS transistor Q10 is coupled in series between transistor Q6 and ground with its source coupled to ground. The gate of transistor Q10 is coupled to the drain of transistor Q10, and transistor Q10 is also gate coupled to transistor Q12.

The common source second stage includes transistors Q3 and Q12, coupled in series between the VDD power supply terminal and the ground terminal. Transistor Q3 is a PMOS transistor having its source coupled to the VDD power supply terminal and its drain coupled to the drain of NMOS transistor Q12. The drain of transistor Q3 and the drain of transistor Q12 are also coupled to an output terminal labeled as OUTP. The output terminal may be used as the output terminal of the operational amplifier 300.

In a scenario in which amplifier 203 is implemented using the architecture of operational amplifier 300, the gate of transistor Q6 may be coupled to the point between resistor 206 and capacitor 205. The gate of transistor Q5 may be coupled to the output terminal OUTP and to the drains of transistors Q3 and Q12, and the gates of the transistors Q5, Q6 and the output terminal OUTP may be biased at VDD/2. Furthermore, the gate of transistor Q5 is not coupled to ground and is not coupled to ground through resistor 206.

In a scenario in which amplifier 202 is implemented using the architecture of operational amplifier 300, the gate of transistor Q5 may be coupled to the output of the charge pump 120 and to resistors 206 and 207 and to the output of amplifier 203 via resistor 207. The gate of transistor Q6 may be coupled to VDD/2, and the drains of transistors Q3 and Q12 (and the output terminal OUTP) may be coupled to the input of VCO 140 and to the capacitors 208 and 205.

In the example above, the sources and drains of the different transistors may be referred to as current path terminals, and the gates may be referred to as control terminals. Furthermore, while some transistors are shown as PMOS transistors, and other transistors are shown as NMOS transistors, the scope of implementations is not so limited. Rather, other embodiments may use a different combination of PMOS transistors and NMOS transistors or may use other transistor technologies, such as bipolar junction transistors or other appropriate transistor technologies.

Figure 4:
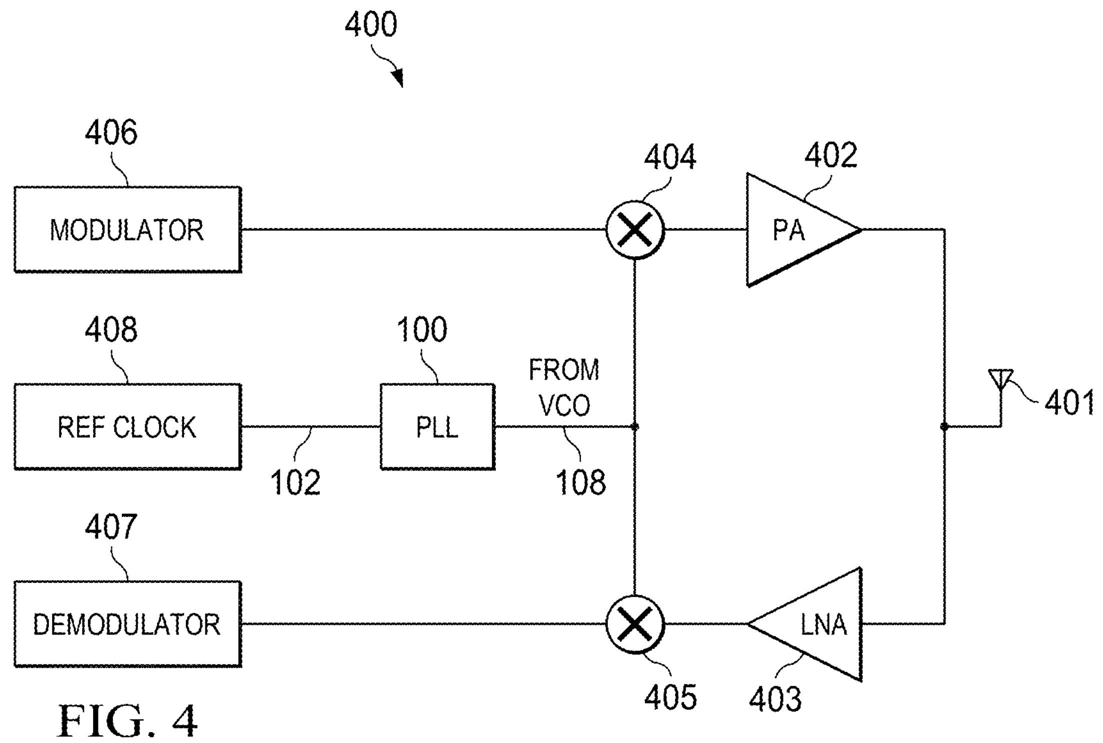
FIG. 4 is an illustration of an example radio frequency (RF) front end, according to some embodiments.

FIG. 4 is an illustration of an example radio frequency (RF) front end 400, according to some embodiments. PLL 100 of FIG. 1 may be implemented as a component within RF front end 400, such as illustrated in FIG. 4.

In this example, a reference clock module 408 may be configured to output a reference clock as reference signal 102 and having a reference phase. Reference signal 102 is received by the PFD 110 of PLL 100. PLL 100 generates output frequency signal 108 from VCO 140. The output frequency signal 108 from VCO 140 is distributed to the mixers 404 and 405. In some examples, RF front end 400 may include one or more LO buffers (not shown) between PLL 100 and each of the mixers 404 and 405.

In the transmit path, modulator 406 outputs modulated analog signals to mixer 404, and mixer 404 up converts those signals to an RF frequency. The up converted signal is applied to the input of power amplifier (PA) 402. The output of power amplifier 402 is sent to antenna 401, where it is radiated through an air medium.

The receive path includes antenna 401, which may receive an RF signal and pass that RF signal to low noise amplifier (LNA) 403. The low noise amplifier 403 adjusts a gain of the received RF signal and passes that gain-adjusted RF signal to mixer 405. Mixer 405 down converts the signal to baseband, where the demodulator 407 performs demodulation on the signal.

Of course, the scope of embodiments may include other applications for PLL 100. Examples of other applications may include clock signal generators in digital systems, local oscillators in communication systems, oscilloscopes and signal analyzers, and the like.

Figure 5:
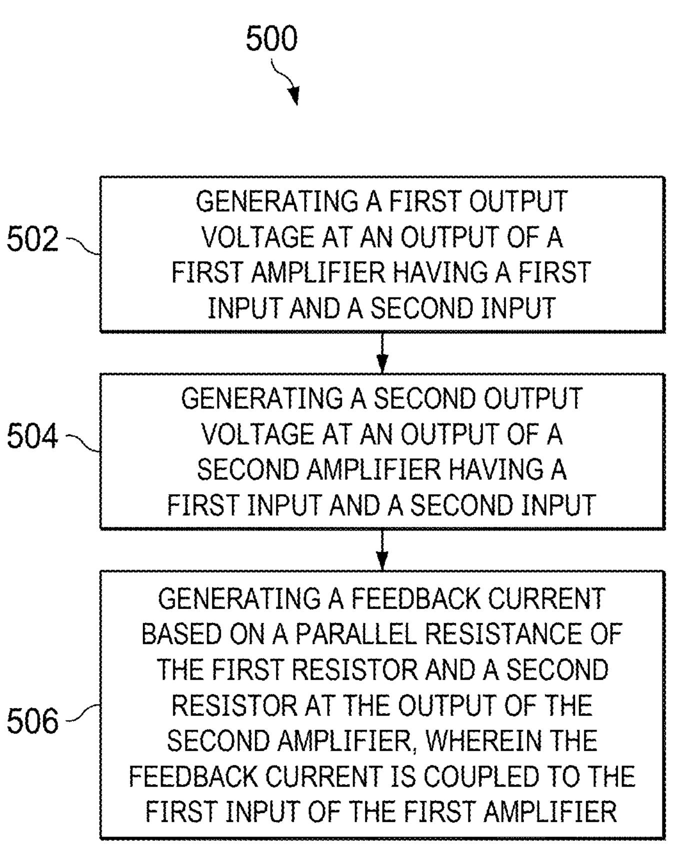
FIG. 5 is an illustration of an example method, according to some embodiments.

FIG. 5 is an illustration of example method 500, according to some embodiments. Method 500 may be performed by a PLL, such as PLL 100 of FIG. 1.

Action 502 includes generating a first output voltage at an output of a first amplifier having a first input and a second input. Action 502 may include receiving a charge pump output, such as current Cpump at the first input of the first amplifier. An example of a first amplifier may include amplifier 202 of FIG. 2, such as may be included within loop filter 130. The example amplifier may include an output that is coupled to the first input of the amplifier, thereby providing a feedback path that may include a capacitor and a resistor. An example is shown in FIG. 2, where the output of amplifier 202 has a feedback path that includes capacitor 205 and resistor 206.

Action 504 includes generating a second output voltage at an output of a second amplifier that has a first input and a first output. For instance, in the example of FIG. 2, the amplifier 203 generates an output voltage at a terminal of resistor 207, where that terminal of resistor 207 is also coupled to the inverting input of amplifier 203. Also, the noninverting input of the second amplifier may be coupled to the feedback path mentioned above, such as being coupled between the resistor and the capacitor, such as resistor 206 and capacitor 205. In this manner, the second output voltage may be generated in response to a voltage sensed between the capacitor and the resistor.

Action 506 may include generating a feedback current based on a parallel resistance of a first resistor and a second resistor at the output of the second amplifier. In the example of FIG. 2, the feedback current IFB is based on the parallel resistance of resistors 206 and 207. The feedback current may be coupled to the first input of the first amplifier, such as being coupled to the inverting input of the amplifier 202 and FIG. 2.

The scope of implementations is not limited only to the actions 502-506, described above. Rather, various embodiments may add, omit, rearrange, or modify various actions. For instance, method 500 may include biasing the first transistor and the second transistor, such as discussed above with respect to FIG. 3. In one example, each of the amplifiers may be operational amplifiers that are powered by a first power supply terminal at VDD and a second power supply terminal at ground, with the inverting and noninverting inputs as well as the outputs of the operational amplifiers being biased at VDD/2, at least during a steady state of the amplifier.

Furthermore, additional actions may include controlling a VCO by the output voltage of the first amplifier, receiving, by a PFD, feedback signal from an output of the VCO, generating by the PFD an error signal based on the feedback signal, and generating, by the charge pump, charge pump output based on the error signal.

Example embodiments of the present disclosure are summarized here. Other embodiments can also be understood from the entirety of the specification and the claims filed herein.

Example 1. A circuit including: a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, where the second terminal of the second resistor is coupled to the first input of the first amplifier, and where the second input of the second amplifier is coupled to the first terminal of the first resistor and the second terminal of the first capacitor.

Example 2. The circuit of example 1, where the first amplifier has an internal topology identical to an internal topology of the second amplifier.

Example 3. The circuit of one of examples 1 or 2, further including a second capacitor coupled between the output of the first amplifier and the second terminal of the first resistor.

Example 4. The circuit of one of examples 1 to 3, where the second amplifier is implemented as a unity gain buffer.

Example 5. The circuit of one of examples 1 to 4, where the first input of the second amplifier is an inverting input and is coupled to the first terminal of the second resistor and to the output of the second amplifier.

Example 6. The circuit of one of examples 1 to 5, where the first resistor has a resistance value at least nine times greater than a resistance value of the second resistor.

Example 7. The circuit of one of examples 1 to 6, where the first input of the first amplifier is an inverting input and is coupled to an output of a charge pump.

Example 8. The circuit of one of examples 1 to 7, where the second input of the first amplifier is a noninverting input and is configured to be biased at one half of a first power supply voltage.

Example 9. The circuit of one of examples 1 to 8, where the first power supply voltage is VDD, where a second power supply voltage is ground, and where one half of the first power supply voltage is VDD/2.

Example 10. The circuit of one of examples 1 to 9, where the first resistor is not coupled to ground.

Example 11. The circuit of one of examples 1 to 10, where the first input of the second amplifier is an inverting input and is not coupled to ground through the first resistor.

Example 12. The circuit of one of examples 1 to 11, where the output of the first amplifier is coupled to a voltage-controlled oscillator (VCO).

Example 13. The circuit of one of examples 1 to 12, where the second amplifier includes: a bias leg; a differential input first stage; and a common source second stage.

Example 14. The circuit of one of examples 1 to 13, where the bias leg includes a first transistor and a second transistor coupled in series between a first power supply voltage terminal and a second power supply voltage terminal, and where the common source second stage includes a third transistor and a fourth transistor coupled in series between the first power supply voltage terminal and the second power supply voltage terminal.

Example 15. The circuit of one of examples 1 to 14, where the differential input first stage includes a fifth transistor coupled to the first power supply voltage terminal, a sixth transistor and a seventh transistor coupled in series between the fifth transistor and the second power supply voltage terminal, and an eighth transistor and a ninth transistor coupled in series between the fifth transistor and the second power supply voltage terminal.

Example 16. The circuit of one of examples 1 to 15, where a control terminal of the second transistor is coupled to a control terminal of the seventh transistor, and where a control terminal of the fourth transistor is coupled to a control terminal of the ninth transistor.

Example 17. The circuit of one of examples 1 to 16, where the output of the second amplifier is coupled to the third transistor and the fourth transistor, where a control terminal of the sixth transistor corresponds to the first input of the second amplifier, and where a control terminal of the eighth transistor corresponds to the second input of the second amplifier.

Example 18. The circuit of one of examples 1 to 17, where the control terminal of the sixth transistor is coupled to the third transistor and to the fourth transistor, and where the control terminal of the eighth transistor is coupled to the first terminal of the first resistor and the second terminal of the first capacitor.

Example 19. The circuit of one of examples 1 to 18, where the control terminal of the sixth transistor is configured to be biased at one half of a first voltage at the first power supply voltage terminal, and where the control terminal of the eighth transistor is configured to be biased at one half of the first voltage.

Example 20. The circuit of one of examples 1 to 19, where the second input of the first amplifier is a noninverting input and is configured to be biased at one half of the first voltage.

Example 21. The circuit of one of examples 1 to 20, where the first amplifier is configured to have a unity gain, and where the second amplifier is configured to have a unity gain.

Example 22. A phase locked loop (PLL) including: a phase frequency detector (PFD) having a reference input, a feedback input, and an output; a charge pump having an input coupled to the output of the PFD, the charge pump further having an output; a filter having an input coupled to the output of the charge pump and having an output; and a voltage-controlled oscillator (VCO) having an input coupled to the output of the filter and having an output coupled to the feedback input of the PFD, where the filter includes a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, and where the second terminal of the second resistor is coupled to the first input of the first amplifier, and where the second input of the second amplifier is coupled to the first terminal of the first resistor and the second terminal of the first capacitor.

Example 23. The PLL of example 22, where the reference input is coupled to a reference clock, further where the output of the VCO is coupled to a first mixer and to a second mixer of a transceiver.

Example 24. The PLL of one of examples 22 or 23, where the first mixer is coupled to an input of a power amplifier (PA), and where the second mixer is coupled to an output of a low noise amplifier (LNA).

Example 25. The PLL of one of examples 22 to 24, where the first amplifier is an operational amplifier, where the first input of the first amplifier is an inverting input, and where the second input of the first amplifier is a noninverting input.

Example 26. The PLL of one of examples 22 to 25, where the second amplifier is an operational amplifier, where the first input of the second amplifier is an inverting input, and where the second input of the second amplifier is a noninverting input.

Example 27. The PLL of one of examples 22 to 26, where the first input of the second amplifier is an inverting input, and where the second input of the second amplifier is a noninverting input, further where the inverting input of the second amplifier is coupled to the first terminal of the second resistor and to the output of the second operational amplifier.

Example 28. The PLL of one of examples 22 to 27, where the first resistor is not coupled to ground.

Example 29. The PLL of one of examples 22 to 28, where the first input of the second amplifier is not coupled to ground by the first resistor.

Example 30. The PLL of one of examples 22 to 29, where the first resistor has a resistance value at least nine times greater than a resistance value of the second resistor.

Example 31. The PLL of one of examples 22 to 30, where the second amplifier includes: a bias leg; a differential input first stage; and a common source second stage.

Example 32. The PLL of one of examples 22 to 31, where the bias leg includes a first transistor and a second transistor coupled in series between a first power supply voltage terminal and a second power supply voltage terminal, and where the common source second stage includes a third transistor and a fourth transistor coupled in series between the first power supply voltage terminal and the second power supply voltage terminal.

Example 33. The PLL of one of examples 22 to 32 where the differential input first stage includes a fifth transistor coupled to the first power supply voltage terminal, a sixth transistor and a seventh transistor coupled in series between the fifth transistor and the second power supply voltage terminal, and an eighth transistor and a ninth transistor coupled in series between the fifth transistor and the second power supply voltage terminal.

Example 34. The PLL of one of examples 22 to 33, where a control terminal of the second transistor is coupled to a control terminal of the seventh transistor, and where a control terminal of the fourth transistor is coupled to a control terminal of the ninth transistor.

Example 35. The PLL of one of examples 22 to 34, where the output of the second amplifier is coupled to the third transistor and the fourth transistor, where a control terminal of the sixth transistor corresponds to the first input of the second op amp, and where a control terminal of the eighth transistor corresponds to the second input of the second amplifier.

Example 36. The PLL of one of examples 22 to 35, where the control terminal of the sixth transistor is coupled to the third transistor and to the fourth transistor, and where the control terminal of the eighth transistor is coupled to the first terminal of the first resistor and the second terminal of the first capacitor.

Example 37. The PLL of one of examples 22 to 36, where the control terminal of the sixth transistor is configured to be biased at one half of a first voltage at the first power supply voltage terminal, and where the control terminal of the eighth transistor is configured to be biased at one half of the first voltage.

Example 38. The PLL of one of examples 22 to 37, where the second input of the first amplifier is configured to be biased at one half of the first voltage.

Example 39. The PLL of one of examples 22 to 38, where the second amplifier is configured as a voltage follower.

Example 40. A method including: receiving a charge pump output of a charge pump at a first input of a first amplifier; generating a first output voltage at an output of the first amplifier, where an output of the first amplifier is coupled to the first input of the first amplifier by a first capacitor and a first resistor; generating a second output voltage at an output of a second amplifier, the second amplifier having a first input and a second input, where the first input of the second amplifier is coupled to the output of the second amplifier, and where the second input of the second amplifier is coupled to a first terminal of the first capacitor and a first terminal of the first resistor; and generating a feedback current based on an output of the second amplifier and based on a current flowing through the first resistor; and providing the feedback current to an intermediate node coupled between the charge pump and the first input of the first amplifier.

Example 41. The method of example 40, further including: powering the first amplifier and the second amplifier with a power supply voltage; and applying a voltage of one half of the power supply voltage to the second input of the first amplifier.

Example 42. The method of one of examples 40 or 41, further including powering the first and second amplifiers with a power supply voltage, where the first and second amplifiers, the first capacitor, and the first resistor are part of a filter, and where, during a steady state of the filter: the first input of the first amplifier is at a voltage level of one half of the power supply voltage level, the second input of the second amplifier is at the voltage level of one half of the power supply voltage level, and the first output voltage is at the voltage level of one half of the power supply voltage level.

Example 43. The method of one of examples 40 to 42, where generating the second output voltage includes applying a unity gain to a voltage at the first terminal of the first capacitor and the first terminal of the first resistor.

Example 44. The method of one of examples 40 to 43, further including: controlling a voltage-controlled oscillator (VCO) by the first output voltage; receiving, by a phase frequency detector (PFD), a feedback signal from an output of the VCO; generating, by the PFD, an error signal based on the feedback signal; and generating, by the charge pump, the charge pump output based on the error signal.

Example 45. A device including: phase locked loop (PLL) including: a phase frequency detector (PFD) having a reference input, a feedback input, and an output; a charge pump having an input coupled to the output of the PFD, the charge pump further having an output; a loop filter having an input coupled to the output of the charge pump and having an output; and a voltage-controlled oscillator (VCO) having an input coupled to the output of the filter and having an output coupled to the feedback input of the PFD, where the filter includes a first amplifier having a first input, a second input, and an output; a second amplifier having a first input, a second input, and an output; a first resistor having a first terminal and a second terminal; a first capacitor having a first terminal and a second terminal, where the first terminal of the first capacitor is coupled to the output of the first amplifier, the second terminal of the first capacitor is coupled to the first terminal of the first resistor, and where the second terminal of the first resistor is coupled to the first input of the first amplifier; and a second resistor having a first terminal and a second terminal, where the first terminal of the second resistor is coupled to the output of the second amplifier, and where the second terminal of the second resistor is coupled to the first input of the first amplifier, and where the second input of the second amplifier is coupled to the first terminal of the first resistor and the second terminal of the first capacitor; and a radio-frequency (RF) front end having an input coupled to the output of the VCO.

Example 46. The device of example 45, further including: a transmitter path; and a receiver path, where the reference input of the PFD is coupled to a reference clock, and where the RF front end is coupled to the transmitter path and the receiver path.

Example 47. The device of one of examples 45 or 46, where the RF front end includes a first mixer and a power amplifier (PA) in the transmit path and a second mixer and a low noise amplifier (LNA) in the receiver path, where the output of the VCO is coupled to the first mixer and to the second mixer.

Example 48. The device of one of examples 45 to 47, further including an antenna coupled to the transmitter path and to the receiver path.

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:

1. A circuit comprising:

a first amplifier having a first input, a second input, and an output;

a second amplifier having a first input, a second input, and an output;

a first resistor having a first terminal and a second terminal;

a first capacitor having a first terminal and a second terminal, wherein the first terminal of the first capacitor is coupled to the output of the first amplifier, the second terminal of the first capacitor is coupled to the first terminal of the first resistor, and wherein the second terminal of the first resistor is coupled to the first input of the first amplifier; and a second resistor having a first terminal and a second terminal, wherein the first terminal of the second resistor is coupled to the output of the second amplifier, wherein the second terminal of the second resistor is coupled to the first input of the first amplifier, and wherein the second input of the second amplifier is coupled to the first terminal of the first resistor and the second terminal of the first capacitor, wherein the first input of the first amplifier is an inverting input and is coupled to an output of a charge pump.

2. The circuit of claim 1, wherein the first amplifier has an internal topology identical to an internal topology of the second amplifier.

3. The circuit of claim 1, further comprising a second capacitor coupled between the output of the first amplifier and the second terminal of the first resistor.

4. The circuit of claim 1, wherein the second amplifier is implemented as a unity gain buffer.

5. The circuit of claim 1, wherein the first input of the second amplifier is an inverting input and is coupled to the first terminal of the second resistor and to the output of the second amplifier.

6. The circuit of claim 1, wherein the first resistor has a resistance value at least nine times greater than a resistance value of the second resistor.

7. The circuit of claim 1, wherein the second input of the first amplifier is a noninverting input and is configured to be biased at one half of a first power supply voltage.

8. The circuit of claim 7, wherein the first power supply voltage is VDD, wherein a second power supply voltage is ground, and wherein one half of the first power supply voltage is VDD/2.

9. The circuit of claim 1, wherein the first resistor is not coupled to ground.

10. The circuit of claim 1, wherein the first input of the second amplifier is an inverting input and is not coupled to ground through the first resistor.

11. A circuit comprising:

a first amplifier having a first input, a second input, and an output;

a second amplifier having a first input, a second input, and an output;

a first resistor having a first terminal and a second terminal;

a first capacitor having a first terminal and a second terminal, wherein the first terminal of the first capacitor is coupled to the output of the first amplifier, the second terminal of the first capacitor is coupled to the first terminal of the first resistor, and wherein the second terminal of the first resistor is coupled to the first input of the first amplifier; and a second resistor having a first terminal and a second terminal, wherein the first terminal of the second resistor is coupled to the output of the second amplifier, wherein the second terminal of the second resistor is coupled to the first input of the first amplifier, and wherein the second input of the second amplifier is coupled to the first terminal of the first resistor and the second terminal of the first capacitor, wherein the output of the first amplifier is coupled to a voltage-controlled oscillator (VCO).

12. A circuit comprising:

a first amplifier having a first input, a second input, and an output;

a second amplifier having a first input, a second input, and an output;

a first resistor having a first terminal and a second terminal;

a first capacitor having a first terminal and a second terminal, wherein the first terminal of the first capacitor is coupled to the output of the first amplifier, the second terminal of the first capacitor is coupled to the first terminal of the first resistor, and wherein the second terminal of the first resistor is coupled to the first input of the first amplifier; and a second resistor having a first terminal and a second terminal, wherein the first terminal of the second resistor is coupled to the output of the second amplifier, wherein the second terminal of the second resistor is coupled to the first input of the first amplifier, and wherein the second input of the second amplifier is coupled to the first terminal of the first resistor and the second terminal of the first capacitor, wherein the second amplifier comprises:

a bias leg;

a differential input first stage; and a common source second stage.

13. The circuit of claim 12, wherein the bias leg includes a first transistor and a second transistor coupled in series between a first power supply voltage terminal and a second power supply voltage terminal, and wherein the common source second stage includes a third transistor and a fourth transistor coupled in series between the first power supply voltage terminal and the second power supply voltage terminal.

14. The circuit of claim 13, wherein the differential input first stage includes a fifth transistor coupled to the first power supply voltage terminal, a sixth transistor and a seventh transistor coupled in series between the fifth transistor and the second power supply voltage terminal, and an eighth transistor and a ninth transistor coupled in series between the fifth transistor and the second power supply voltage terminal.

15. The circuit of claim 14, wherein a control terminal of the second transistor is coupled to a control terminal of the seventh transistor, and wherein a control terminal of the fourth transistor is coupled to a control terminal of the ninth transistor.

16. The circuit of claim 15, wherein the output of the second amplifier is coupled to the third transistor and the fourth transistor, wherein a control terminal of the sixth transistor corresponds to the first input of the second amplifier, and wherein a control terminal of the eighth transistor corresponds to the second input of the second amplifier.

17. The circuit of claim 15, wherein the control terminal of the sixth transistor is coupled to the third transistor and to the fourth transistor, and wherein the control terminal of the eighth transistor is coupled to the first terminal of the first resistor and the second terminal of the first capacitor.

18. The circuit of claim 17, wherein the control terminal of the sixth transistor is configured to be biased at one half of a first voltage at the first power supply voltage terminal, and wherein the control terminal of the eighth transistor is configured to be biased at one half of the first voltage.

19. The circuit of claim 18, wherein the second input of the first amplifier is a noninverting input and is configured to be biased at one half of the first voltage.

20. The circuit of claim 11, wherein the first amplifier is configured to have a unity gain, and wherein the second amplifier is configured to have a unity gain.

21. The circuit of claim 11, wherein the first amplifier has an internal topology identical to an internal topology of the second amplifier.

22. The circuit of claim 11, further comprising a second capacitor coupled between the output of the first amplifier and the second terminal of the first resistor.

23. The circuit of claim 11, wherein the second amplifier is implemented as a unity gain buffer.

24. The circuit of claim 11, wherein the first input of the second amplifier is an inverting input and is coupled to the first terminal of the second resistor and to the output of the second amplifier.

25. The circuit of claim 11, wherein the first resistor has a resistance value at least nine times greater than a resistance value of the second resistor.

* * * * *